(12) United States Patent
Kim

(10) Patent No.: US 7,955,913 B2
(45) Date of Patent: Jun. 7, 2011

(54) METHOD FOR MANUFACTURING SEMICONDUCTOR DEVICE

(75) Inventor: Kyu Sung Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 233 days.

(21) Appl. No.: 12/134,036

(22) Filed: Jun. 5, 2008

(65) Prior Publication Data

US 2009/0111239 A1   Apr. 30, 2009

(30) Foreign Application Priority Data

Oct. 29, 2007   (KR) .................. 10-2007-0109149

(51) Int. Cl.
*H01L 21/00* (2006.01)
(52) U.S. Cl. .. 438/157; 438/268; 438/283; 257/E21.629
(58) Field of Classification Search .................. 438/157, 438/268, 270, 283; 257/E21.301, E21.629
See application file for complete search history.

(56) References Cited

U.S. PATENT DOCUMENTS

2002/0094622 A1 * 7/2002 Sneelal et al. ................ 438/197
2007/0012997 A1   1/2007 Chung et al. .................. 257/331

FOREIGN PATENT DOCUMENTS

| KR | 10-2005-0106306 | 11/2005 |
| KR | 10-2006-0130322 | 12/2006 |
| KR | 10-0675290 | 1/2007 |

OTHER PUBLICATIONS

Machine Translation of KR-10-0675290; Ahn et all, Jan. 29, 2007.*
Notice of Rejection for Korean Patent Application No. 10-2007-0109149, dated Apr. 19, 2008.

* cited by examiner

*Primary Examiner* — Asok K Sarkar
*Assistant Examiner* — Julia Slutsker
(74) *Attorney, Agent, or Firm* — Marshall, Gerstein & Borun LLP

(57) ABSTRACT

A method for manufacturing a semiconductor device includes determining an active region in a semiconductor substrate, forming a recess in a gate region crossing over the active region, annealing an oxide layer formed in the recess to oxidize the active region in the gate region, and etching the active region by using the oxidized active region as an etch mask.

13 Claims, 13 Drawing Sheets

(i)

(ii)

(iii)

(i)

(ii)

(iii)

METHOD FOR MANUFACTURING SEMICONDUCTOR DEVICE

CROSS-REFERENCE TO RELATED APPLICATION

The priority of Korean patent application number 10-2007-0109149, filed on Oct. 29, 2007, the disclosure of which is incorporated by reference in its entirety, is claimed.

BACKGROUND OF THE INVENTION

The invention relates generally to a method for manufacturing a semiconductor device and, more specifically, to a method for manufacturing a transistor including a multi channel.

Generally, a semiconductor manufacturing process includes fabrication, electric die sorting, assembly, and testing. The fabrication includes repeating diffusion, photo-resist patterning, etching, and deposition over a wafer several times to form electric circuits, thereby obtaining semi-finished products that can be electrically operated upon in a wafer phase.

As the critical dimension (CD) of a gate decreases in size due to the high degree of integration of semiconductor devices, channel length is reduced, thereby causing a short channel effect (SCE) where an electrical characteristic of a field effect transistor (FET) is degraded.

In order to prevent the degradation of the electrical characteristic, there has been suggested transistor that includes a recessed gate and a channel region having a three-dimensional, rather than a two-dimensional, structure. The channel length denotes a distance between a source and a drain of the transistor. The recessed gate formed in a trench generated from a process of etching a semiconductor substrate by a predetermined depth, not formed on a top surface of the semiconductor substrate, can increase a channel length because the channel region is formed along walls of the trench.

Recently, semiconductor devices designed to reduce power consumption with high integration have been required. Particularly, for reduction of power consumption, the amount of leakage or consumed current due to resistance and capacitance in the semiconductor device should be decreased so that a driving current is consumed most effectively while the semiconductor device is operated. In order to effectively consume the driving current, it has been suggested that a transistor may include a double gate structure, where double gates are respectively positioned on sides of a channel region, as opposed to in the center of the channel region.

As an example of the transistor including the double gate structure, there is a transistor including a fin gate that surrounds a fin-shaped channel region. The fin gate improves a driving capacity of gate of the transistor so as to make the driving current use in the semiconductor device effectively and, notwithstanding a narrow width of the fin-shaped channel region, substantially increases a channel length between a source and a drain of the transistor so as to prevent the SCE. That is, according to a potential of the fin gate, an active region, i.e., a channel, in the fin-shaped channel region is formed in a bent shape along a contact surface between the fin gate and the fin-shaped channel region, thereby increasing a driving capacity of the gate and improving an efficiency of electricity.

Further, to prohibit a transistor included in a highly integrated semiconductor device from the SCE, a transistor including a recessed gate has been suggested. Unlike a conventional transistor, the recessed gate is formed at lower level than source/drain of the transistor. The source and the drain are formed on top of the substrate, and the recessed gate is formed in a lower part of a trench between the source/drain of the substrate. As a depth of the trench is deeper and a depth of the source/drain is shallower, a channel length of the transistor is longer.

Meanwhile, a semiconductor device with a high degree of integration is required to operate at high speed. For meeting a high operation speed, a multi-channel Field Effect Transistor (FET) including plural channels has been suggested. Because, through the plural channels, movement of carriers between source and drain is facilitated, speed of operation of the transistor can increase. In addition, when the transistor includes a multi-channel, a driving current capability of the transistor is also improved.

As above described, a semiconductor device qualified in views of integration, speed, and power consumption should have advantages of a fin-shaped gate, a recessed gate, and a multi-channel. However, it is difficult to form a fine multi-channel of the semiconductor device over a semiconductor substrate through photolithography with a photo-resist pattern. Also, because of reduction of design rules, it is easy to cause short between neighboring source and drain regions when active regions of source and drain corresponding to the fine gate pattern is grown by a silicon epitaxial growth (SEG) method.

BRIEF SUMMARY OF THE INVENTION

Various embodiments of the invention are directed at providing a method for manufacturing a semiconductor device that includes recessing a gate channel region using an oxide film formed by an annealing process with a hard mask for forming a multi-channel so that source/drain regions may be formed to be relatively higher than the gate channel region without requiring an SEG process.

Various embodiments of the invention are directed at providing a semiconductor device that includes a multi-channel FET having two fins obtained by etching a middle portion of an active region using an oxide film formed by an annealing process as a hard mask, thereby improving driving current capability and gate power of controlling a channel including SCE.

According to one embodiment of the invention, a method for manufacturing a semiconductor device comprises determining an active region in a semiconductor substrate, forming a recess over the active region in a gate region crossing over the active region, annealing an oxide layer formed in the recess to oxidize the active region in the gate region, and etching the active region to form multi fins in the active region by using the oxidized active region as an etch mask.

Preferably, the multi fins are located at lower level than a source/drain in the active region.

Preferably, determining an active region comprises forming a trench in the semiconductor substrate, forming an oxide film inside the trench, forming a nitride film on the oxide film, and filling the trench with an isolation layer.

Preferably, the recess is formed by etching the isolation layer in the gate region, etching the exposed nitride film, and filling the recess with the oxide layer.

Preferably, the oxide layer comprises a layer of flowable oxide material.

Preferably, the method for manufacturing a semiconductor device further comprises removing the oxidized active region to expose multi fins, forming an gate oxide layer on the multi fins, and forming a gate pattern on the gate oxide layer.

According to another embodiment of the invention, a method for manufacturing a semiconductor device comprises annealing a first oxide layer adjacent to a second oxide layer surrounding an active region to permeate the second oxide layer into the active region, thereby enlarging the second oxide film, and etching the active region by using enlarged second oxide layer as an etching mask.

Preferably, the method for manufacturing a semiconductor device further comprises forming an isolation layer determining the active region, removing a nitride layer surrounding the active region in a gate region to expose the second oxide layer, and forming the first oxide layer in the gate region.

Preferably, the isolation layer is formed by forming a pad oxide layer and a pad nitride layer on a semiconductor substrate, etching the pad oxide layer, the pad nitride layer, and the semiconductor substrate by using a mask defining the active region to form a trench, forming the second oxide layer inside the trench, forming the nitride layer on the second oxide and the etched pad nitride layer, filling the trench with he isolation layer, and planarizing the isolation layer until the etched pad nitride layer is exposed.

Preferably, the first and the second oxide layers comprise layers of a flowable oxide material, and the active region preferably comprises a doped silicon layer.

Preferably, the nitride layer is removed by etching back the isolation layer in the gate region to expose the active region.

Preferably, the method for manufacturing a semiconductor device further comprises removing the enlarged second oxide layer to expose the active region, forming a gate oxide layer on the exposed active region, and forming a gate pattern on the gate oxide layer.

Preferably, the exposed active region comprises multi fins.

According to a further embodiment of the invention, a semiconductor device comprises a gate pattern crossing over an active region including a source and a drain, a gate oxide layer under the gate pattern, and a multi fin channel under the gate oxide layer, wherein the multi fin channel is located at lower level than the source and the drain.

Preferably, the multi fin channel is located in the active region superposed upon the gate pattern.

Preferably, the semiconductor device further comprises an isolation layer for determining the location of the active region in a semiconductor substrate.

DESCRIPTION OF EMBODIMENTS

Figure 1A:
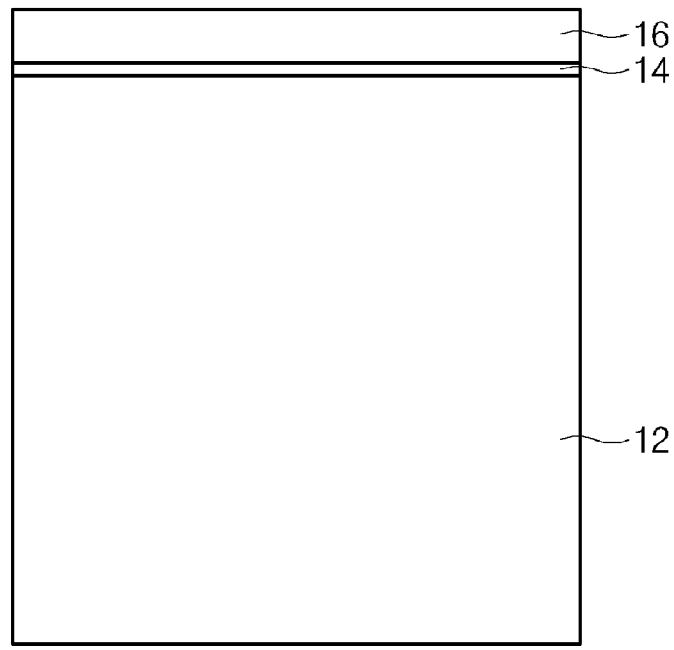
FIGS. 1a to 1q are cross-sectional diagrams illustrating a method for manufacturing a semiconductor device according to an embodiment of the invention.
Figure 1B:
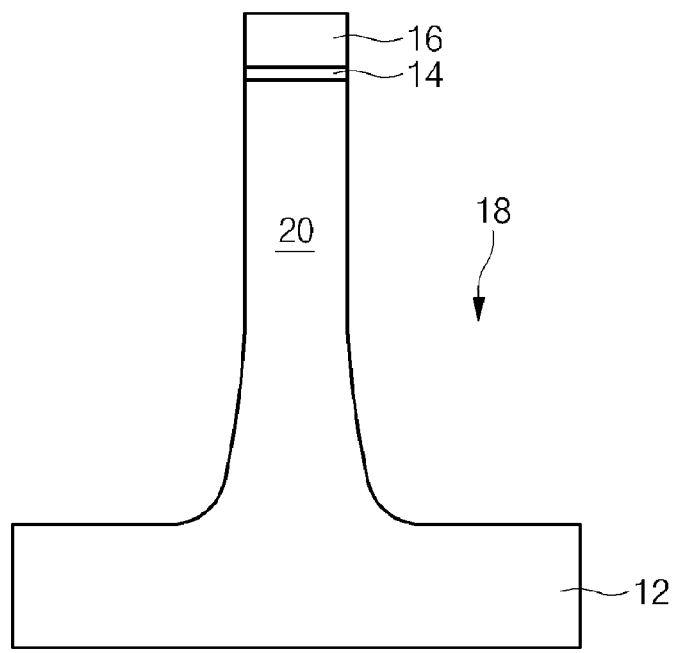
Figure 1C:
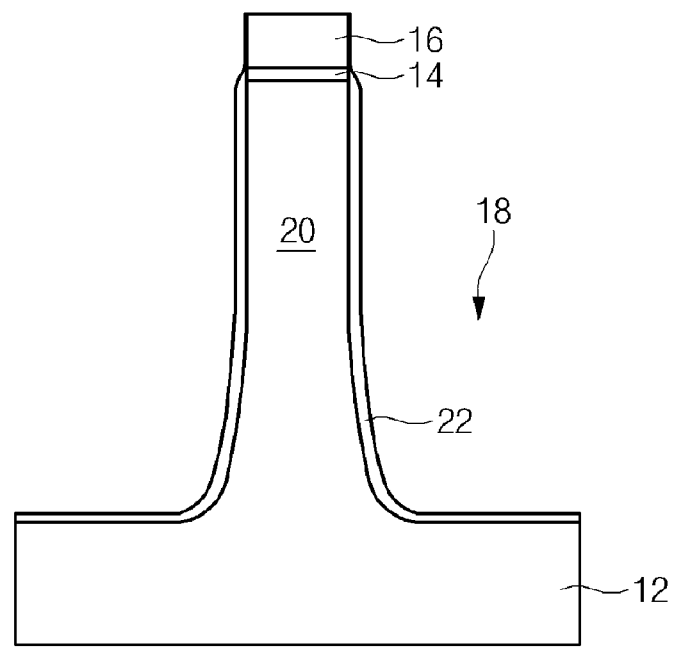
Figure 1D:
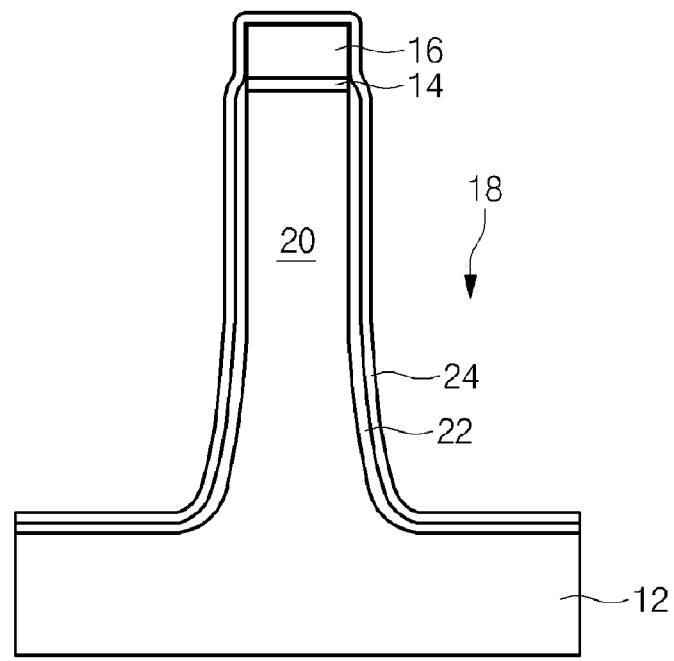
Figure 1E:
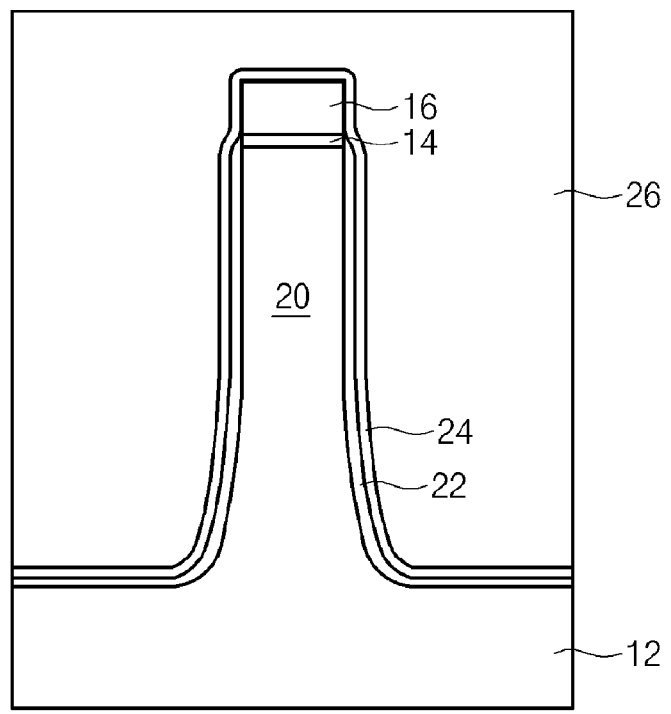
Figure 1F:
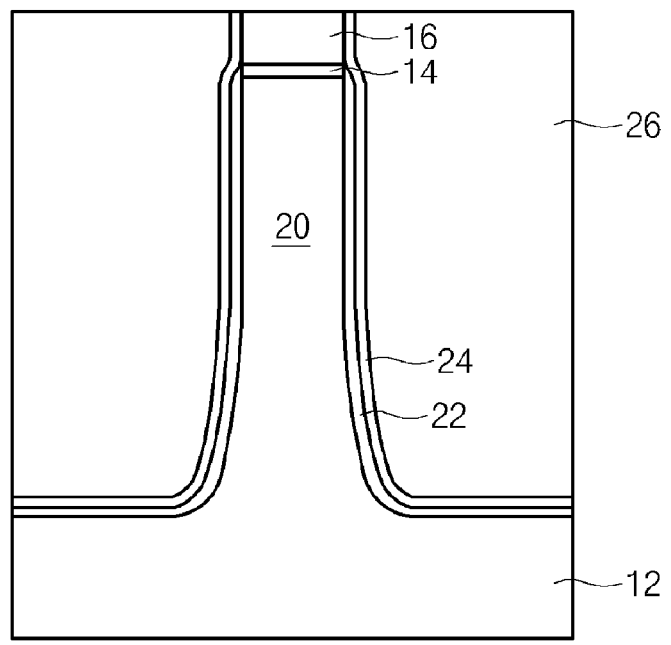
Figure 1G:
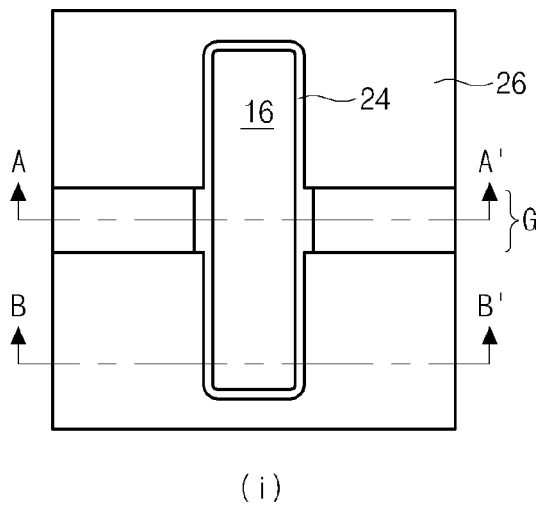
Figure 1G:
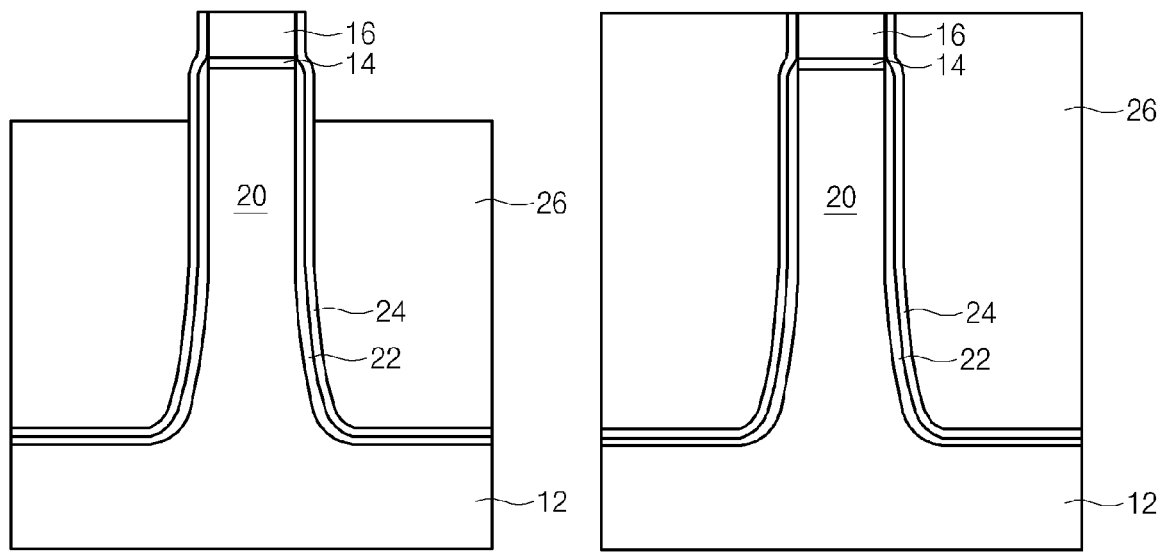
Figure 1H:
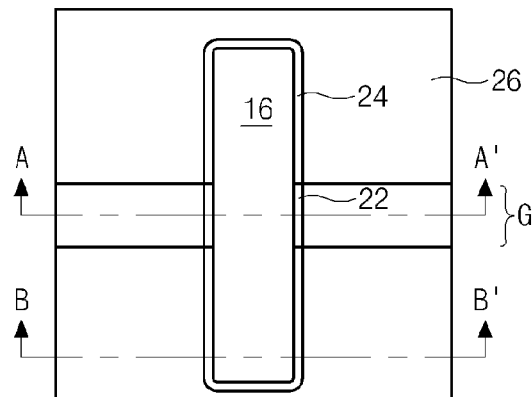
Figure 1H:
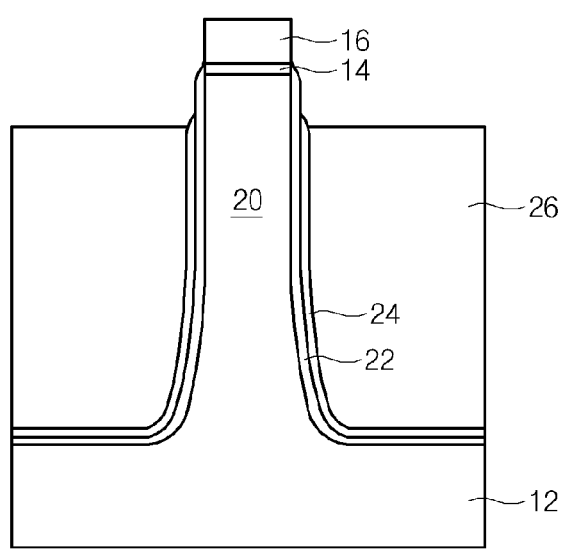
Figure 1H:
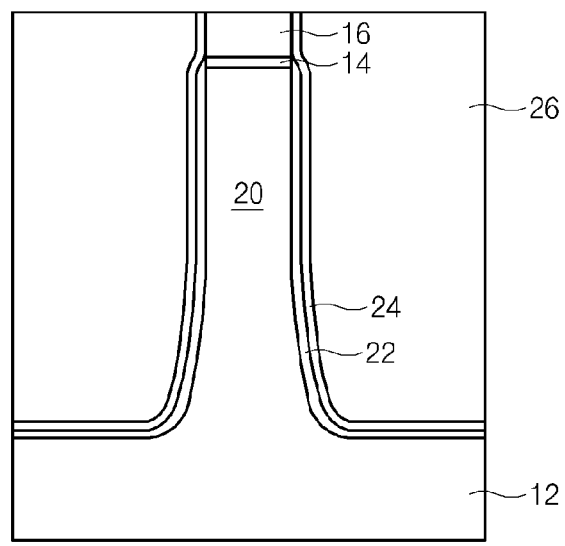
Figure 1I:
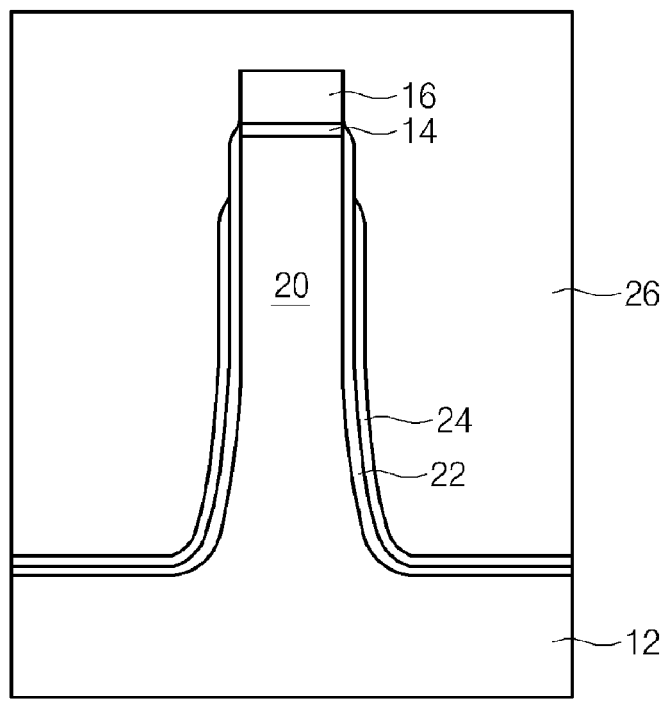
Figure 1J:
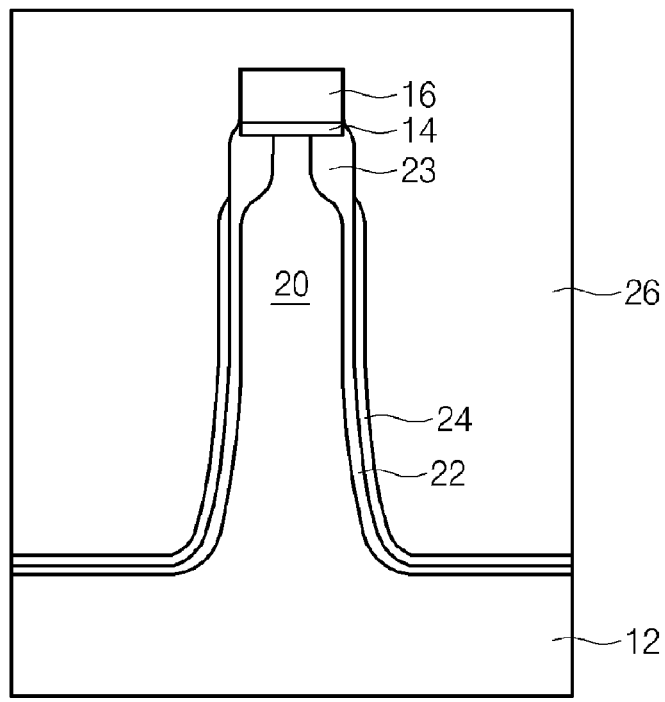
Figure 1K:
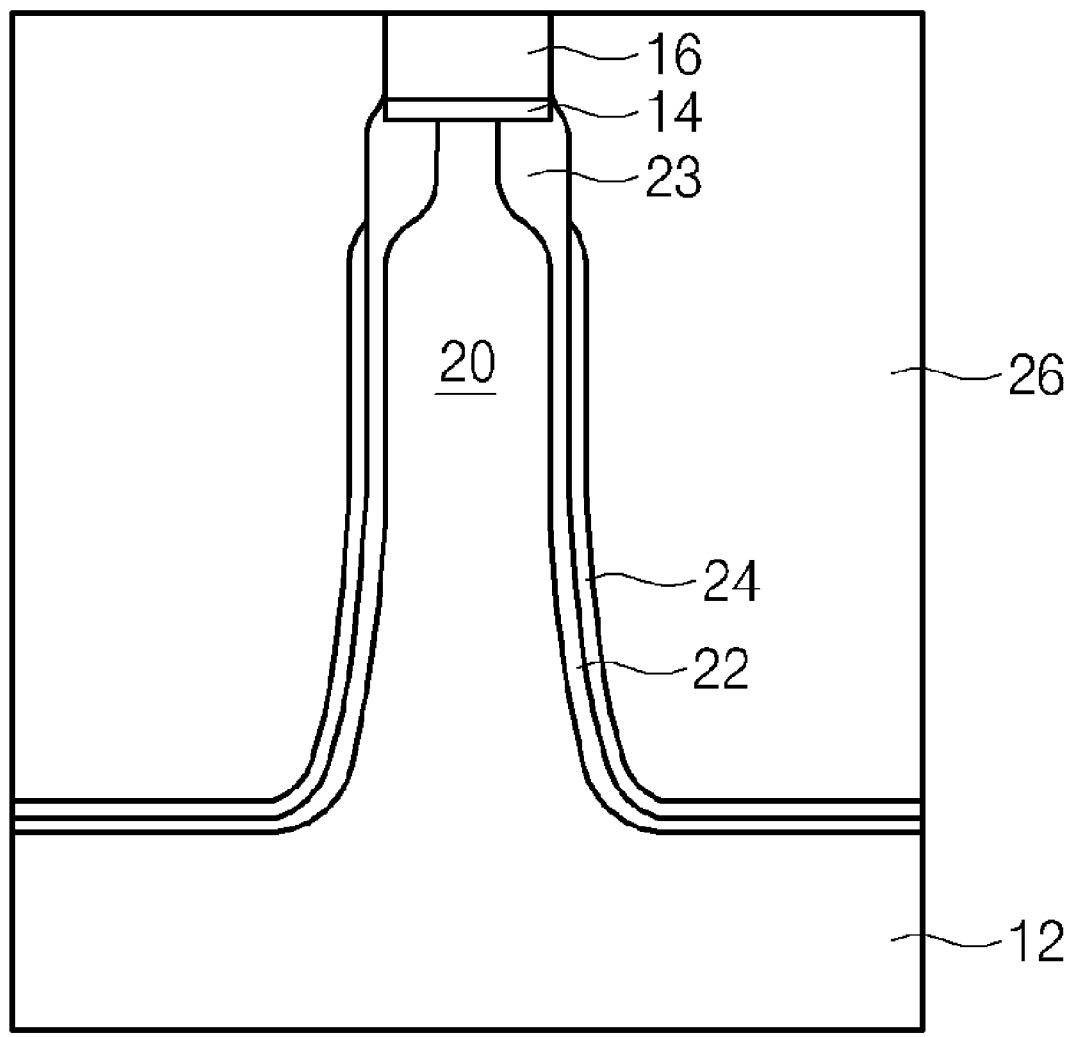
Figure 1I:
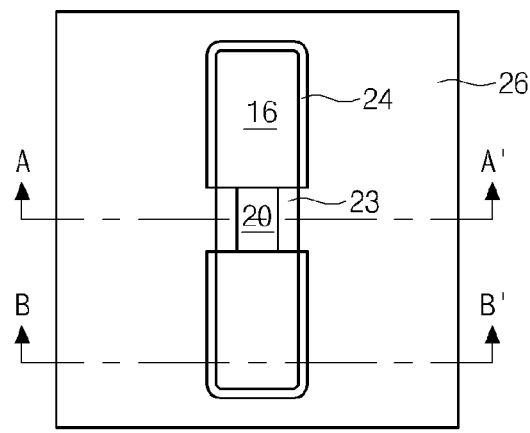
Figure 1I:
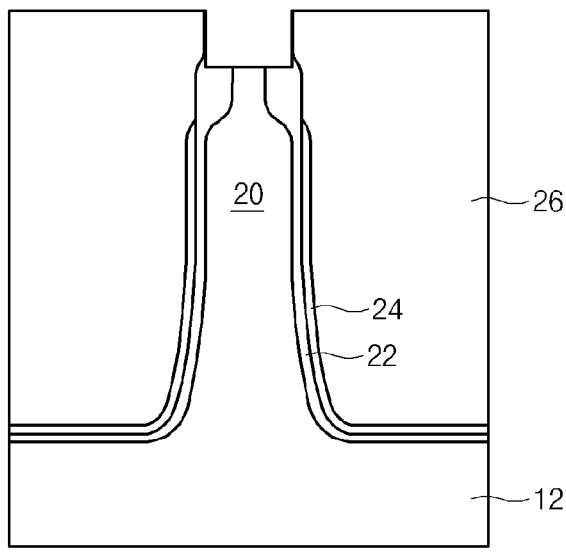
Figure 1I:
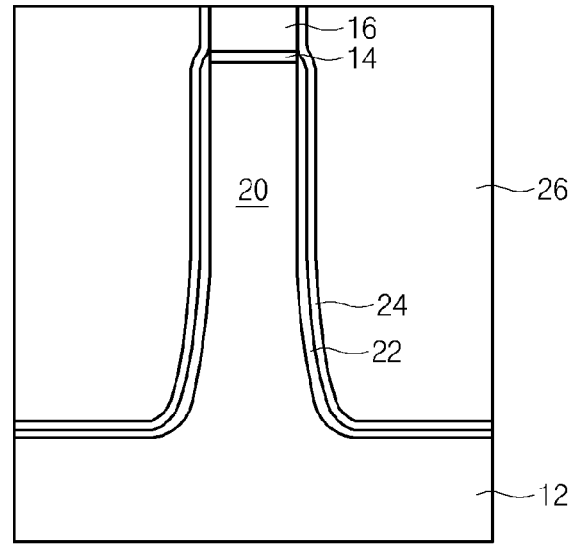
Figure 1M:
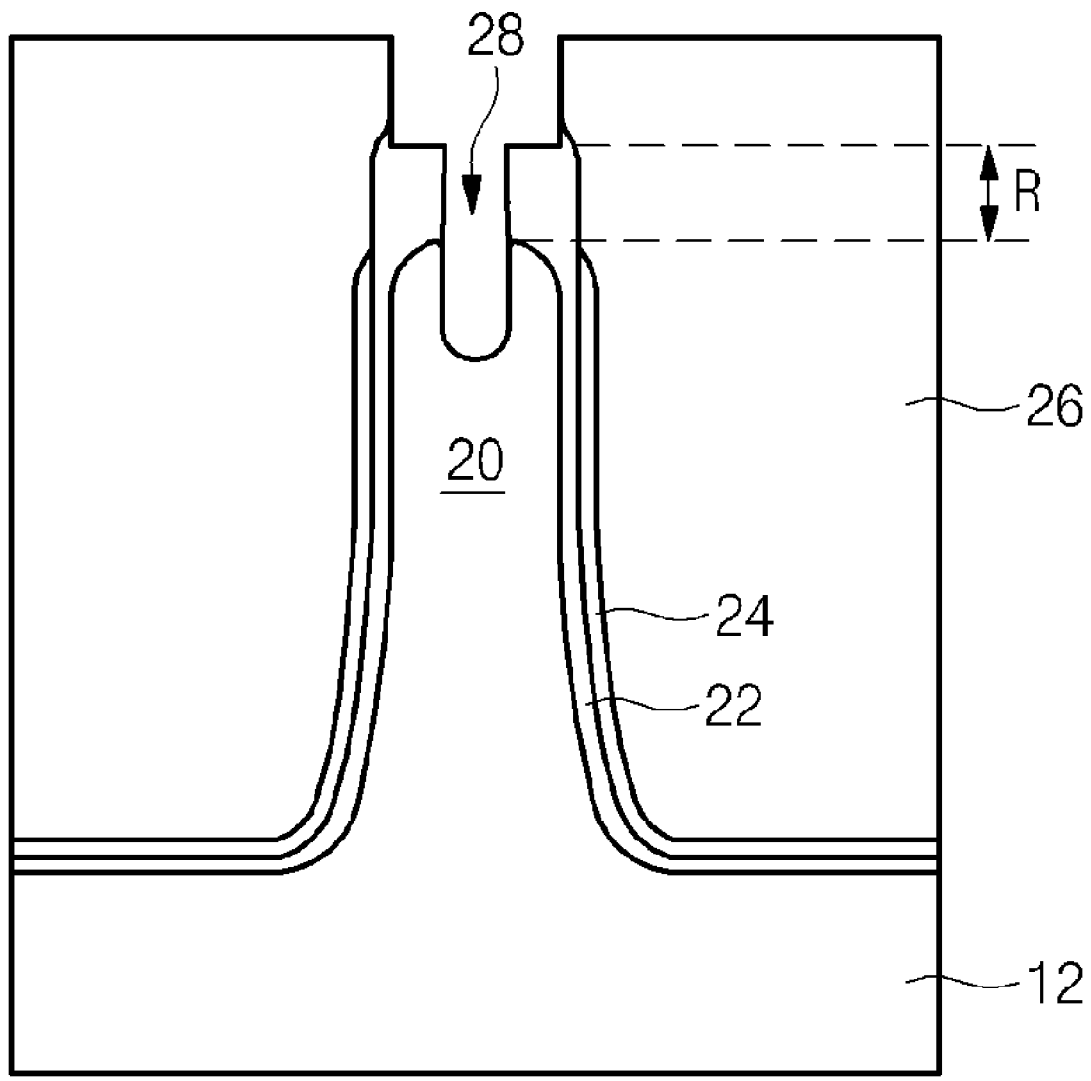
Figure 1N:
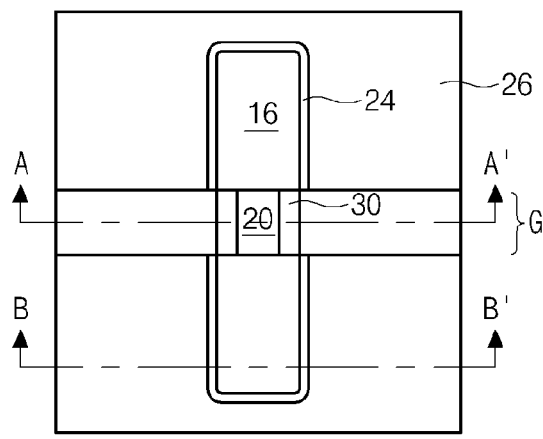
Figure 1N:
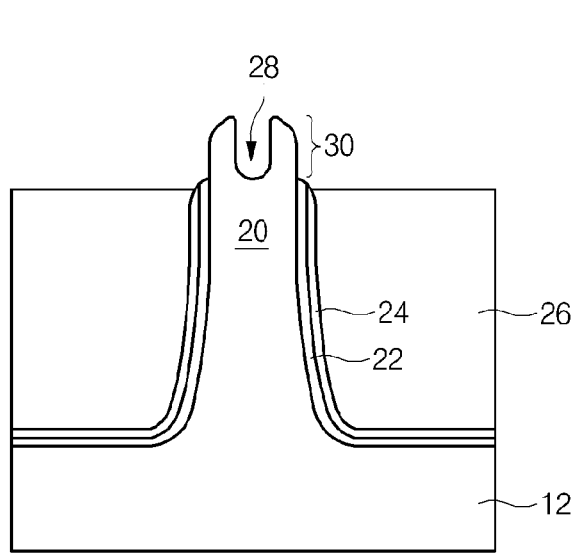
Figure 1N:
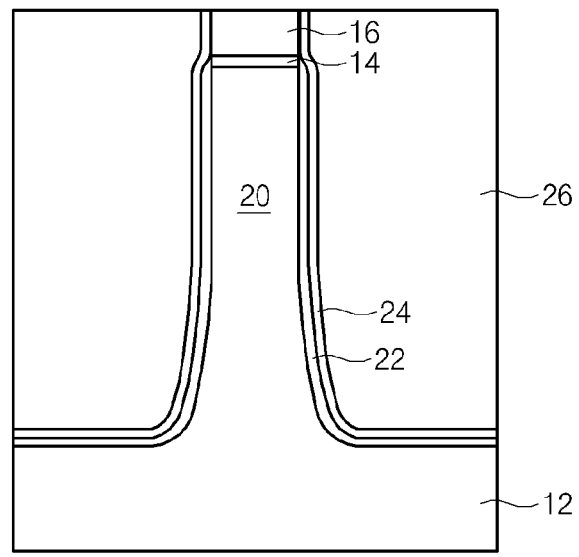
Figure 1O:
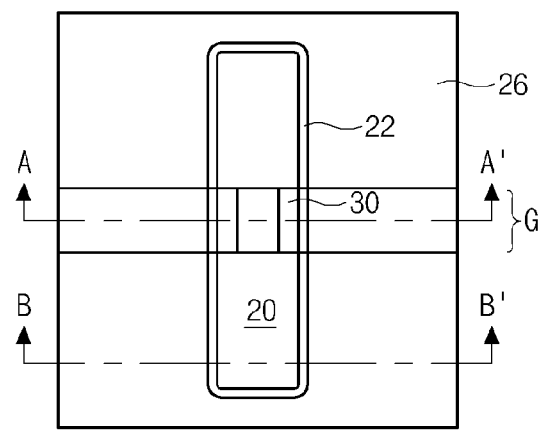
Figure 1O:
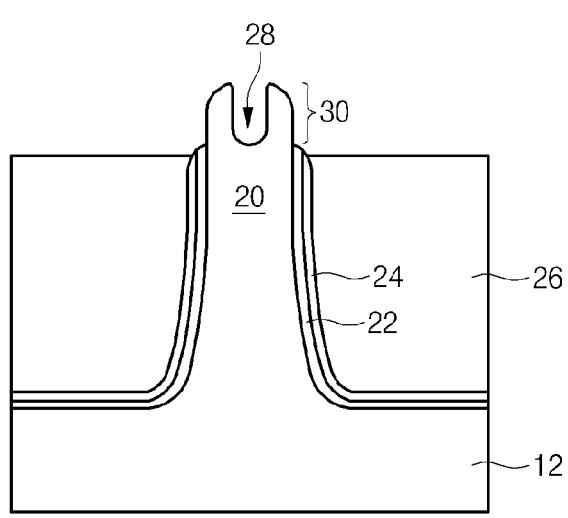
Figure 1O:
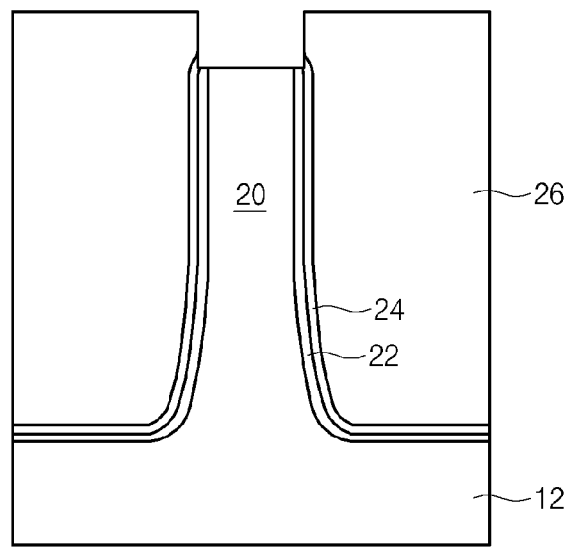
Figure 1P:
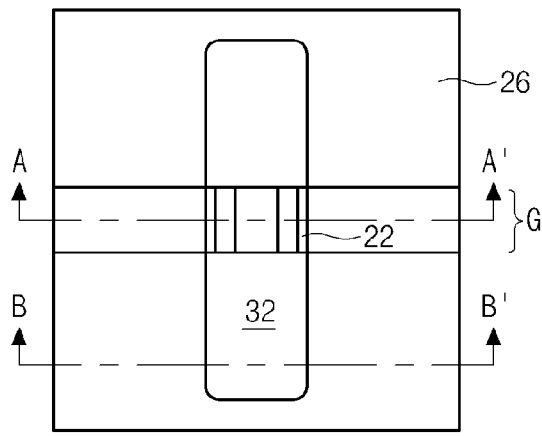
Figure 1P:
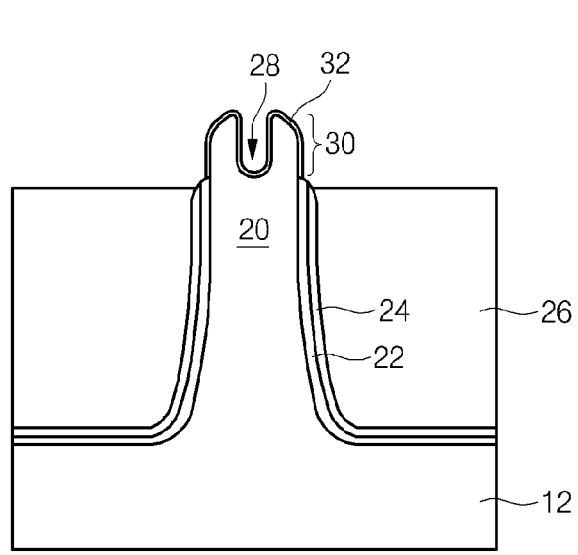
Figure 1P:
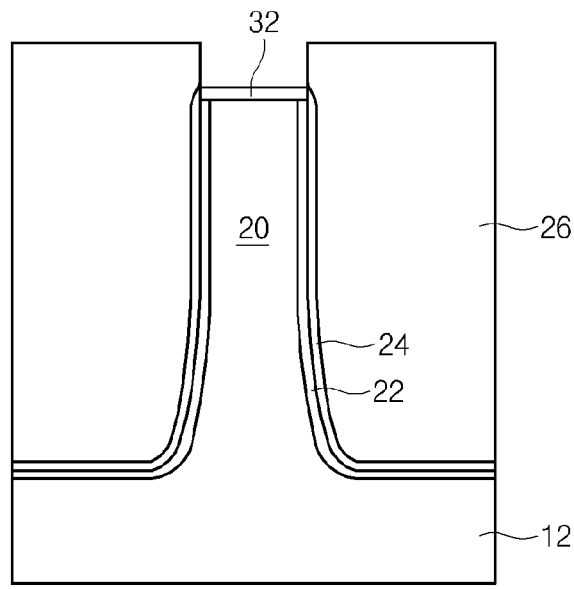
Figure 1Q:
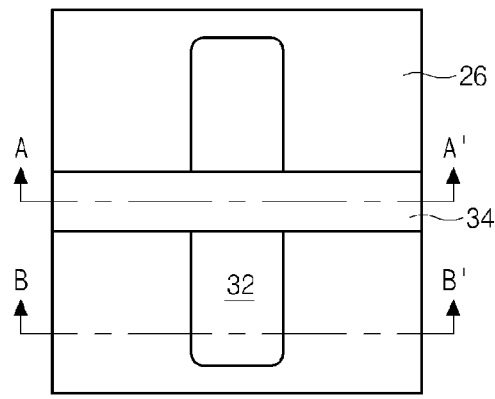
Figure 1Q:
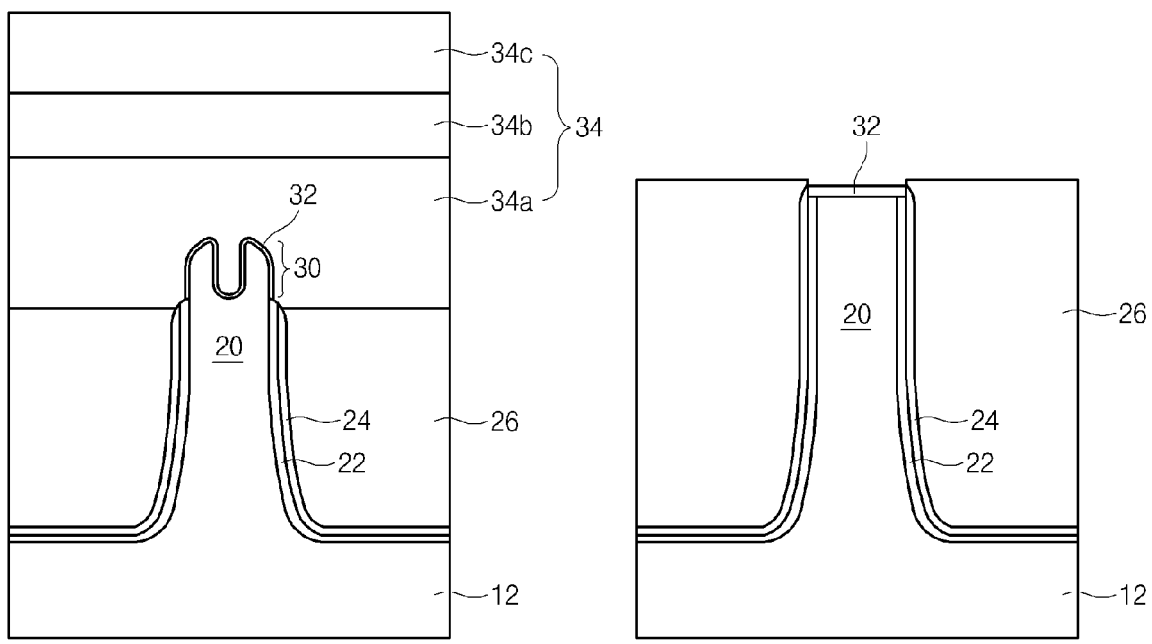

FIGS. 1a to 1q are cross-sectional diagrams illustrating an exemplary method for manufacturing a semiconductor device according to an embodiment of the invention. In FIGS. 1g, 1h, 1l, 1n, 1o, 1p, and 1q, (i) is a plane diagram, (ii) is a cross-sectional diagram taken along A-A', and (iii) is a cross-sectional diagram taken along B-B'.

Referring to FIG. 1a, an oxide film 14 is formed over a semiconductor substrate 12, preferably by thermal oxidation. A pad nitride film 16 is formed over the pad oxide film 14.

Referring to FIG. 1b, a photo-etching or other suitable process is performed with a photoresist pattern or a hard mask pattern to form a trench 18 for forming a device isolation film that defines an active region 20. The hard mask pattern preferably includes an amorphous carbon layer (not shown).

Referring to FIGS. 1c and 1d, a sidewall oxide film 22 that serves as a buffer is formed in the trench 18. A nitride film 24 is formed over the sidewall oxide film 22 and sidewalls of the pad nitride film 16.

Referring to FIG. 1e, an oxide film, preferably and illustratively a flowable oxide (FOX) film 26 is deposited over the resulting structure that fills the trench 18. In FIG. 1f, a planarization process is performed to expose the pad nitride film 16, so that a device isolation film formed by a shallow trench isolation (STI) method may be obtained. The planarization process is preferably performed by a chemical mechanical polishing (CMP) process.

Referring to FIGS. 1g and 1h, the FOX film 26 expected to be a gate G is partially etched to expose a top portion of the active region 20 and remove the nitride film 24 formed at sidewalls of the active region 20.

Referring to FIGS. 1i and 1j, the FOX film 26 is re-deposited over the resulting structure. An annealing process is performed to remove the nitride film 24, thereby forming a thermal oxide film 23 in the active region 20 exposed by the nitride film 24 through thermal oxidation. Thus, silicon exposed over the active region 20 where the nitride film 24 is removed is oxidized by the FOX film 26 during the annealing process. The portion of the active region 20 closer to the surface of the FOX film 26 is exposed to heat during the annealing process, and the oxidized thickness therefore increases.

Referring to FIGS. 1k and 1l, a planarization process is performed to expose the pad nitride film 16 (FIG. 1k). The exposed pad nitride film 16 expected to be a gate region G is then removed (FIG. 1j).

Referring to FIGS. 1m and 1n, an isotropic etching process is performed on the active region 20 using the thermal oxide film 23 formed by the annealing process as an etching mask, thereby forming a hole 28 having a desired, predetermined depth. In FIG. 1n, the FOX film 26 expected to be a gate region G is partially etched to the depth of the hole 28. The thermal oxide film 23 is removed to expose the top portion of the active region 20. The top portion of the exposed active region 20 has the hole 28 in the middle portion. An active region 30 is formed to have two horn-shaped fin shapes at both sides of the active region 20. The active region 30 is recessed lower than the active region 20, which is not expected to be a gate region G but is formed to have a source/drain by a depth (R, FIG. 1m) of the thermal oxide film 23 that serves as a hard mask.

Referring to FIGS. 1o and 1p, the pad nitride film 16 that remains over the active region 20 is removed, and a gate oxide film 32 is formed over the active region 20 including the fin-shaped active region 30.

Referring to FIG. 1q, a gate electrode layer, a gate conductive layer, and a gate hard mask material layer are sequentially deposited over the resulting structure. The hard mask material layer, the gate conductive layer, and the gate electrode layer are sequentially etched with a gate mask to form a gate pattern 34 including a gate electrode 34a, a gate conductive layer 34b, and a gate hard mask 34c. The gate electrode 34a preferably comprises polysilicon, the gate conductive layer 34b preferably comprises tungsten (W or $WSi_x$), and the gate hard mask 34c preferably comprises a nitride film.

As described above, the invention provides a method for manufacturing a multi fin type FET. A middle portion of an active region is etched with an oxide film formed by an annealing process as an etching mask, thereby forming a multi-channel transistor having two fins which are separated from each other by a fine space. As a result, the multi-channel transistor has a finer fin pattern rather than by an etching process using a photoresist pattern.

Although the multi-channel transistor having two fins is exemplified in the illustrated embodiment of the invention, a multi-fin type FET can be formed so that each active region which is multi-layered in an array may be formed to have two fins by the above-described process.

In order to form a multi channel in the embodiment of the invention, a region corresponding to a gate channel region of the active regions is recessed. An oxide film is deposited in the recessed gate channel region, and an annealing process is performed to form a thermal oxide film over the recessed gate channel region. The recessed gate channel region is etched with the thermal oxide film to form a multi fin. As a result, the two fins are formed lower than source/drain region obtained by doping impurities into the active region by a given depth. The embodiment of the invention where a recess is formed in the active region and the gate channel region is formed under the recess does not require a silicon epitaxial growth (SEG) process that has been performed in the prior art to form an active region, e.g., a source/drain region, higher than a channel region after forming a fin-shaped channel region.

Therefore, in the illustrated embodiment of the invention, the gate channel region is recessed with the oxide film formed by the annealing process as a hard mask for forming a multi-channel, so that source/drain regions are formed to be relatively higher without the SEG process. Also, a middle portion of the active region is etched with the oxide film formed by the annealing process as a hard mask to obtain a multi-channel FET having two fins, thereby improving the SCE.

The illustrated embodiments of the invention are illustrative and not limiting. Various alternatives and equivalents are possible. The invention is not limited by the type of deposition, etching polishing, and patterning steps describe herein, nor is the invention limited to any specific type of semiconductor device. For example, the invention may be implemented in a dynamic random access memory (DRAM) device or a non-volatile memory device. Other additions, subtractions, or modifications are intended to fall within the scope of the appended claims.

What is claimed is:

1. A method for manufacturing a semiconductor device, the method comprising:
    defining an active region in a semiconductor substrate;
    defining a gate region crossing over the active region;
    forming a recess in the active region located in the gate region;
    forming an oxide layer in the recess;
    annealing the oxide layer formed in the recess to oxidize the active region in the gate region, wherein the oxidized active region permeates into a sidewall of the active region; and
    forming multi fins in the active region by etching the active region exposed by the oxidized active region.

2. The method according to claim 1, wherein the active region defines a source/drain and the multi fins are located at a lower level than the source/drain in the active region.

3. The method according to claim 1, wherein defining an active region comprises:
    forming a trench in the semiconductor substrate;
    forming an oxide film inside the trench;
    forming a nitride film on the oxide film; and
    filling the trench with an isolation layer.

4. The method according to claim 3, wherein forming a recess comprises:
    etching the isolation layer in the gate region;
    etching the exposed nitride film; and
    filling the recess with the oxide layer.

5. The method according to claim 1, wherein the oxide layer comprises a layer of a flowable oxide material.

6. The method according to claim 1, further comprising:
    removing the oxidized active region to expose multi fins;
    forming an gate oxide layer on the multi fins; and
    forming a gate pattern on the gate oxide layer.

7. A method for manufacturing a semiconductor device, the method comprising:
    providing a semiconductor substrate defining an active region surrounded by a second oxide layer with a first oxide layer adjacent to the second oxide layer;
    permeating the second oxide layer into a sidewall of the active region by performing an annealing process to the first oxide layer, thereby forming an enlarged second oxide layer; and
    etching the active region by using the enlarged second oxide layer as an etching mask.

8. The method according to claim 7, wherein the active region is surrounded by a nitride layer in a gate region, the method further comprising:
    forming an isolation layer defining the active region;
    removing the nitride layer surrounding the active region in a gate region to expose the second oxide layer; and
    forming the first oxide layer in the gate region.

9. The method according to claim 8, comprising forming the isolation layer by:
    sequentially forming a pad oxide layer and a pad nitride layer on a semiconductor substrate;
    forming a trench by etching the pad oxide layer, the pad nitride layer, and the semiconductor substrate by using a mask defining the active region;
    forming the second oxide layer inside the trench;
    forming the nitride layer on the second oxide layer and the etched pad nitride layer;
    filling the trench with the isolation layer; and
    planarizing the isolation layer until the etched pad nitride layer is exposed.

10. The method according to claim 9, wherein the first and the second oxide layers comprise a layer of a flowable oxide material, and the active region comprises a doped silicon layer.

11. The method according to claim 8, comprising removing the nitride layer by etching back the isolation layer in the gate region to expose the active region.

12. The method according to claim 7, further comprising:
    removing the enlarged second oxide layer to expose the active region;
    forming a gate oxide layer on the exposed active region; and
    forming a gate pattern on the gate oxide layer.

13. The method according to claim 12, wherein the exposed active region defines multi fins.

* * * * *